United States Patent [19]
Kuo et al.

[11] Patent Number: 6,005,803
[45] Date of Patent: Dec. 21, 1999

[54] MEMORY ADDRESS DECODING CIRCUIT FOR A SIMULTANEOUS OPERATION FLASH MEMORY DEVICE WITH A FLEXIBLE BANK PARTITION ARCHITECTURE

[75] Inventors: Tiao-Hua Kuo, San Jose; Yasushi Kasa, Cupertino; Nancy Leong, Sunnyvale; Johnny Chen, Cupertino; Michael Van Buskirk, Saratoga, all of Calif.

[73] Assignees: Advanced Micro Devices, Inc., Sunnyvale, Calif.; Fujitsu Limited, Kanagawa-Ken, Japan

[21] Appl. No.: 09/159,342

[22] Filed: Sep. 23, 1998

[51] Int. Cl.[6] ........................................... G11C 7/00
[52] U.S. Cl. ................. 365/185.11; 365/185.13; 365/230.04; 365/230.06
[58] Field of Search .................... 365/185.11, 185.13, 365/230.03, 230.04, 230.06

[56] References Cited

U.S. PATENT DOCUMENTS

| | | | |
|---|---|---|---|
| 5,245,572 | 9/1993 | Kosonocky et al. | 364/189.02 |
| 5,712,823 | 1/1998 | Gillingham | 365/230.06 |
| 5,841,696 | 11/1998 | Chen et al. | 365/185.11 |
| 5,847,998 | 12/1998 | Van Buskirk | 365/185.33 |
| 5,867,490 | 2/1999 | Chen et al. | 365/189.04 |

*Primary Examiner*—Vu A. Le
*Attorney, Agent, or Firm*—Fliesler, Dubb, Meyer & Lovejoy

[57] ABSTRACT

A decoding circuit 54 for a simultaneous operation non-volatile memory device with a flexible bank partition architecture comprises an X-decoder 44, a lower bank decoder 58, an upper bank decoder 56, and a plurality of flexibly partitioned conductive lines coupled between the upper and lower bank decoders 56 and 58. The flexibly partitioned conductive lines 60, 62, 64, . . . 74 provide a plurality of bank address pre-decoding bits for the X-decoder 44 to row decode the memory cells along the respective word lines in the memory array 20. The memory array 20 includes a plurality of flexibly partitioned bit lines comprising first and second bit line segments to partition the memory array into upper and lower memory banks. The bit line segments in the upper and lower memory banks are coupled to two Y-decoders 32 and 34 which provide column decoding for the memory cells in the upper and lower memory banks.

70 Claims, 5 Drawing Sheets

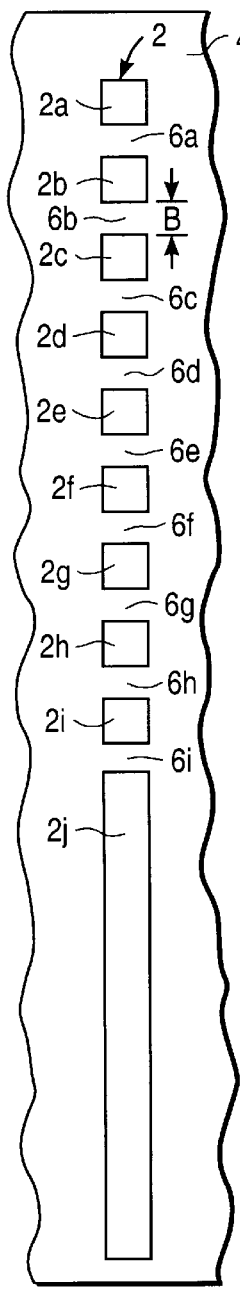
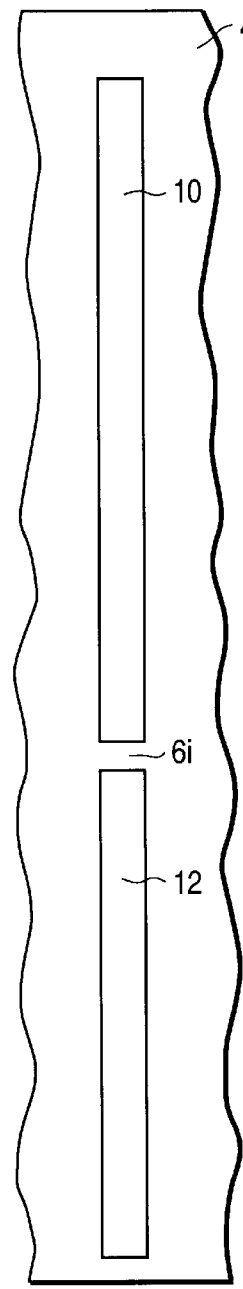
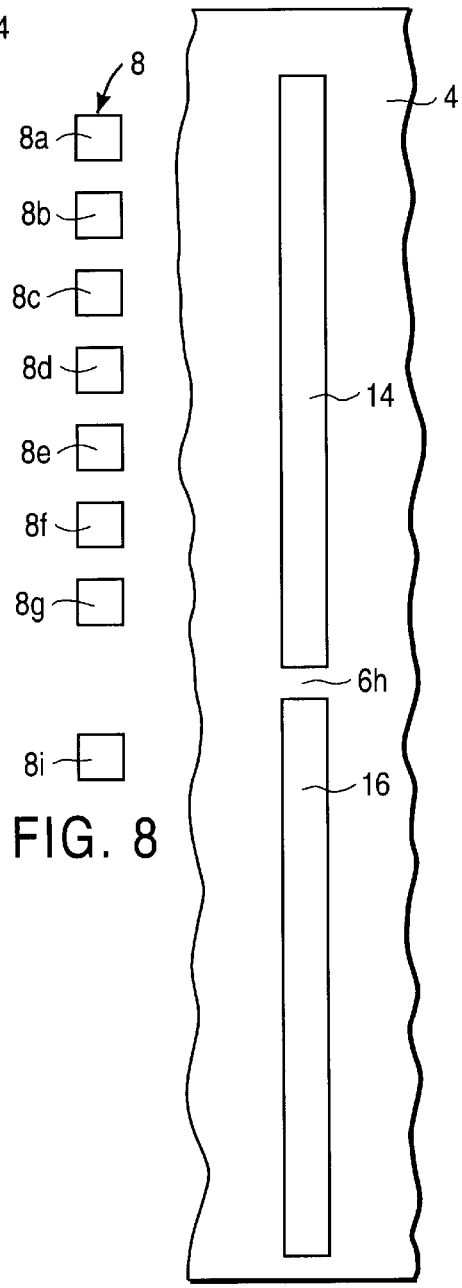
FIG. 5  FIG. 6  FIG. 7  FIG. 8  FIG. 9

MEMORY ADDRESS DECODING CIRCUIT FOR A SIMULTANEOUS OPERATION FLASH MEMORY DEVICE WITH A FLEXIBLE BANK PARTITION ARCHITECTURE

TECHNICAL FIELD

The present invention relates to a flash memory device, and more particularly, to a decoding circuit for a simultaneous operation flash memory device with a flexible bank partition architecture.

BACKGROUND ART

Non-volatile memory devices have been developed by the semiconductor integrated circuit industry for various applications such as computers and digital communications. A conventional non-simultaneous operation flash memory device typically includes a single fixed memory bank. A conventional simultaneous operation flash memory device typically includes two fixed memory banks each comprising a fixed number of sectors of memory cells. Each sector of memory cells has a fixed amount of memory storage, for example, 0.5 megabytes (MB) of memory and consists of a fixed number pages of memory cells, for example, sixteen pages of memory cells. A page is typically defined as one word of memory stored in the memory cells on a single word line.

In a conventional simultaneous operation flash memory device, such as a conventional simultaneous operation NOR flash memory array, the memory cells are divided into an upper memory bank and a lower memory bank. The upper and lower memory banks each have a predetermined fixed size of memory storage. The upper and lower memory banks are typically used for different functions in simultaneous reading and writing operations. For example, the lower memory bank may be used for code storage, whereas the upper memory bank may be used for data storage.

Since the upper and lower memory bank partitions are fixed in conventional simultaneous operation flash memory devices, different flash memory devices with different integrated circuit designs are required for different memory partitions. Therefore, in order to customize the memory circuit for a variety of applications which require different partitions of the upper and lower memory banks for code and data storage, a different circuit design would be required for each of the fixed upper and lower memory bank partitions in a conventional simultaneous operation flash memory device.

Because the size of memory storage in each of the upper and lower memory banks is not variable in a conventional simultaneous operation non-volatile memory device, a single circuit design may be suitable for only one of several different applications in which different partitions of the upper and lower memory banks are required. In order to produce simultaneous operation flash memory devices with different partitions of the upper and lower memory banks, a different circuit design and a different set of associated masks are required for each of the devices.

A disadvantage of having to design a different integrated circuit and a full set of different masks for each of the simultaneous operation flash memory devices with different upper and lower memory bank partitions is that the design, fabrication and testing processes can be very costly and time-consuming. Therefore, there is a need for a simultaneous operation flash memory device with a flexible bank partition architecture. Furthermore, there is a need for a simplified decoding architecture for the simultaneous operation flash memory device with a flexible bank partition architecture.

DISCLOSURE OF THE INVENTION

The present invention satisfies these needs. In accordance with the present invention, a memory address decoding circuit for a simultaneous operation non-volatile memory device with a flexible bank partition architecture generally comprises:

(a) a plurality of flexibly partitioned conductive lines each comprising first and second conductive line segments separated by a gap designating a memory partition boundary between upper and lower memory banks;

(b) an upper memory bank decoder coupled to the first conductive line segments of the flexibly partitioned conductive lines and capable of receiving at least some of a plurality of upper bank memory address bits;

(c) a lower memory bank decoder coupled to the second conductive line segments of the flexibly partitioned conductive lines and capable of receiving at least some of a plurality of lower bank memory address bits; and (d) a bank address pre-decoding output capable of generating a plurality of bank address pre-decoding bits, a first plurality of the bank address pre-decoding bits coupled to the first conductive line segments for the upper memory bank and a second plurality of the bank address pre-decoding bits coupled to the second conductive line segments for the lower memory bank.

In an embodiment, the decoding circuit for the simultaneous operation non-volatile memory device with a flexible bank partition architecture according to the present invention further comprises an X-decoder coupled to receive the bank address pre-decoding output from the flexibly partitioned conductive lines. The X-decoder may be further coupled to receive at least one fixed bank address pre-decoding input in addition to the flexibly partitioned bank address pre-decoding bits. In a further embodiment, the decoding circuit according to the present invention further comprises an inverter coupled between the bank address pre-decoding output and the X-decoder to generate a plurality of inverted bank address decoding bits for the X-decoder to row decode the memory cells in the memory array. In yet a further embodiment, at least one additional inverter is coupled between the at least one fixed bank pre-decoding input and the X-decoder to invert the fixed bank memory address pre-decoding input.

In an additional embodiment, the flexibly partitioned conductive lines in the decoding circuit according to the present invention are fabricated from a metal layer having a plurality of predetermined memory boundary options, each of the memory boundary options capable of forming the gap which separates the first and second conductive line segments. In a further embodiment, the first and second conductive line segments are formed by electrically connecting the memory boundary options along each of the flexibly partitioned conductive lines but leaving one of the memory boundary options open, to form the gap between the first and second conductive line segments.

The present invention also provides a simultaneous operation non-volatile memory device with a flexible bank partition architecture which generally comprises:

(a) a memory array comprising a plurality of memory cells arranged in a plurality of rows and columns;

(b) a plurality of flexibly partitioned bit lines coupled to the respective columns of the memory cells, each of the bit lines comprising first and second bit line segments separated by a gap designating a memory partition boundary between upper and lower memory banks, the memory partition boundary selected from a plurality of predetermined partition boundaries; and (c) a decoding circuit, coupled to the memory array, comprising:

(i) a plurality of flexibly partitioned conductive lines each comprising first and second conductive line segments separated by a gap designating the memory boundary between the upper and lower memory banks;

(ii) an upper memory bank decoder coupled to the first conductive line segments of the flexibly partitioned conductive line and capable of receiving at least some of a plurality of upper bank address bits;

(iii) a lower memory bank decoder coupled to the second conductive line segments of the flexibly partitioned conductive lines and capable of receiving at least some of a plurality of lower bank address bits; and (iv) a bank address pre-decoding output capable of generating a plurality of bank address pre-decoding bits, a first plurality of the bank address pre-decoding bits coupled to the first conductive line segments for the upper memory bank and a second plurality of the bank address pre-decoding bits coupled to the second conductive line segments for the lower memory bank.

In a further embodiment, the simultaneous operation non-volatile memory device according to the present invention further comprises an X-decoder coupled to the bank address pre-decoding output and to provide a plurality of row decoding signals to the word line in the memory array. The X-decoder may be further coupled to receive at least one fixed bank address pre-decoding input in addition to the flexibly partitioned bank address decoding bits. In a further embodiment, the decoding circuit further comprises a plurality of inverters coupled to the inputs of the X-decoder to invert the flexibly partitioned bank address pre-decoding bits as well as the fixed bank pre-decoding input to generate a plurality of inverted bank address pre-decoding bits for the X-decoder to provide the row decoding signals to the memory array.

Advantageously, the present invention provides a simultaneous operation non-volatile memory device with a flexible bank partition architecture and a decoding circuit for the memory device. A further advantage of the present invention is that it allows flexible partitioning of a simultaneous operation flash memory device into upper and lower memory banks with memory partition boundaries selected from a plurality of predetermined partition boundaries by simply selecting the gaps which define the selected partition boundary between the upper and lower memory banks in the bit lines in the memory array and in the conductive lines in the decoding circuit. Yet a further advantage to the present invention is that only one X-decoder is needed for the row decoding of the memory array. Furthermore, the pre-decoding structure which provides the bank address pre-decoding bits for the X-decoder includes a plurality of flexibly partitioned conductive lines between upper and lower bank decoders, and is adaptable to the flexibly partitioned flash memory array with a variety of memory partition boundaries.

BRIEF DESCRIPTION OF THE DRAWINGS

The present invention will be described with respect to particular embodiments thereof, and references will be made to the drawings in which:

FIG. 5 shows a simplified plan view of a basic metal layer with a plurality of gaps separating the basic metal layer into a plurality of basic metal layer segments;

FIG. 6 shows a simplified plan view of a plurality of metal option layer segments before they are provided on the basic metal layer as shown in FIG. 5;

FIG. 7 shows a simplified plan view of metal layer after the metal option layer segments as shown in FIG. 6 are provided on the basic metal layer as shown in FIG. 5;

FIG. 8 shows a simplified plan view of another pattern of metal option layer segments before they are provided on the basic metal layer as shown in FIG. 5; and FIG. 9 shows a simplified plan view of a basic metal layer after the metal option layer segments as shown in FIG. 8 are provided on the basic metal layer as shown in FIG. 5.

MODES FOR CARRYING OUT THE INVENTION

Figure 1:
FIG. 1 is a diagram showing an embodiment of a simultaneous operation flash memory device comprising a plurality of blocks of memory cells with a plurality of flexibly partitioned boundary lines that are capable of partitioning the memory boundary into an upper memory bank and a lower memory bank.

FIG. 1 shows a simplified diagram of a simultaneous operation non-volatile memory device, for example, a NOR flash memory device which includes a plurality of sectors of memory cells indicated by blocks SA0, SA1, SA2, . . . SA63. The memory sectors SA0, SA1, SA2, . . . SA63 are arranged in a plurality of rows and columns, with each row containing four memory sectors. The rows of the memory sectors are numbered consecutively from Z4(0) to Z4(15). The NOR flash memory device as shown in FIG. 1 further includes memory sectors SS0, SS1, SS2, . . . SS7 arranged in rows Z4(16) to Z4(17).

In the example shown in FIG. 1, each sector of the memory cells SA0, SA1, SA2, . . . SA63 includes 0.5 megabytes (MB) of memory, and each row of the memory sectors Z4(0), Z4(1), Z4(2), . . . Z4(15) includes 2 MB of memory. The last memory sector SA63 is optional and may be regarded as a hidden memory sector. The total memory capacity of the memory sectors SS0, SS1, SS2, . . . SS7 is on the order of about 0.5 MB. The 0.5 MB of memory in the sectors SS0, SS1, SS2, . . . SS7 may be regarded as a predetermined minimum lower bank memory required for code storage. FIG. 1 also shows a plurality of memory partition boundary lines, each of which is capable of bisecting the memory into an upper memory bank and a lower memory bank. An example of some possible partitions of a 32 MB simultaneous operation flash memory device with a flexible bank partition architecture according to the present invention is illustrated in FIG. 1, with the number before the slash denoting the amount of memory in the upper memory bank and the number after the slash denoting the amount of memory in the lower memory bank. The memory partition boundary can be set between any adjacent rows of memory sectors, with each adjacent boundary change resulting in either an increment or a decrement of 2 MB in the upper and lower memory banks if each memory sector contains 0.5 MB of memory and each row contains 4 memory sectors.

The arrangement of the blocks of memory cells in a simultaneous operation flash memory device as shown in FIG. 1 is merely an illustrative example of many different possible memory partitions in a simultaneous operation flash memory device with a flexible bank partition architecture according to the present invention. However, the present invention is not limited to the memory partition boundaries as illustrated in FIG. 1; other memory partition boundaries are also feasible. For example, where as FIG. 1 shows the memory partition boundaries which yield a minimum of 16 MB and a maximum of 31.5 MB of memory in the upper memory bank and a minimum of 0.5 MB and a maximum of 16 MB of memory in the lower memory bank, other memory partition boundaries can be set which give the upper bank less than 16 MB of memory and the lower bank more than 16 MB of memory. For example, flexible memory partition boundaries can also be set between the rows Z4(0) and Z4(1), between Z4(1) and Z4(2), and so on.

Figure 2:
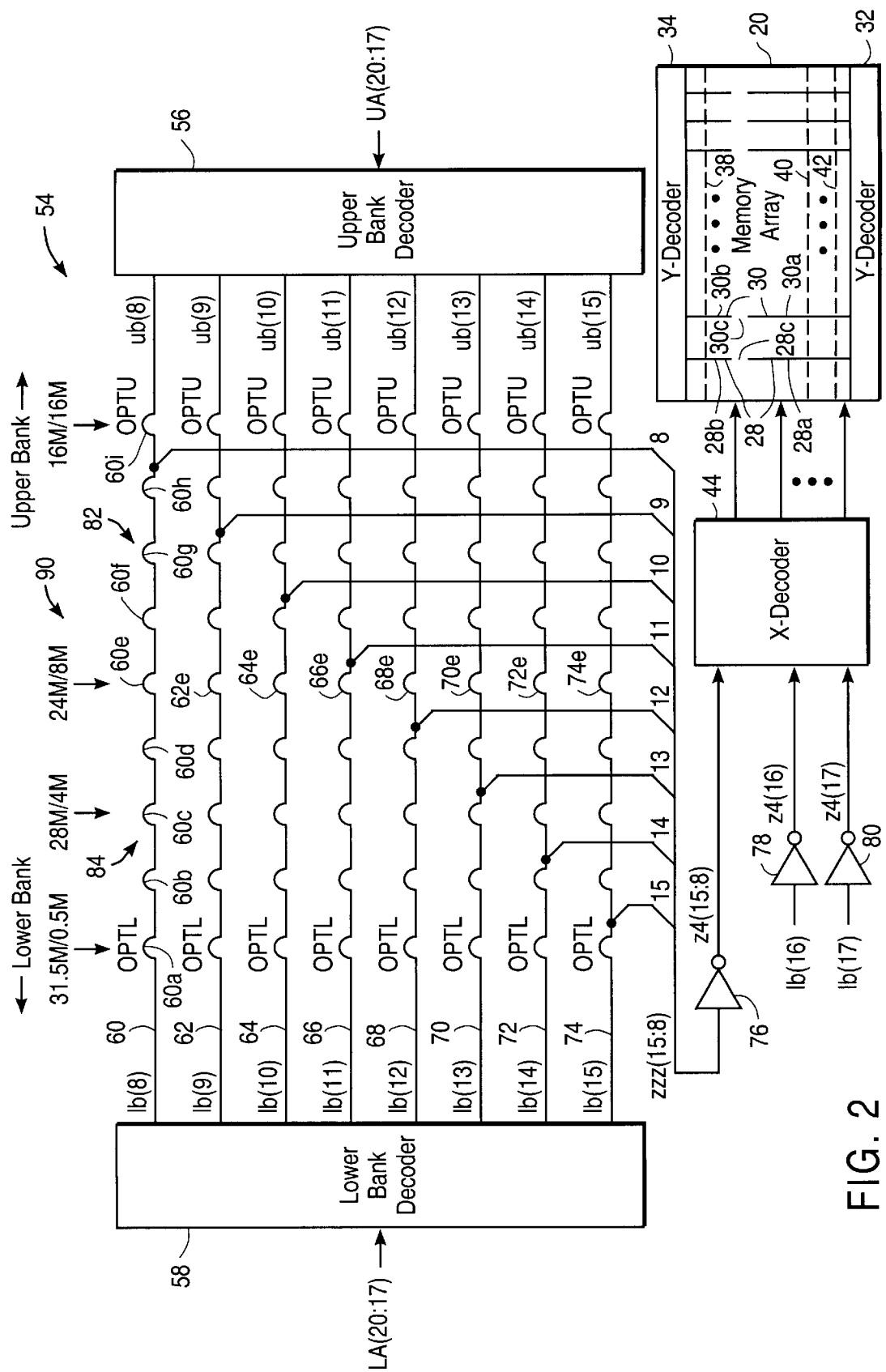
FIG. 2 is a block diagram showing an embodiment of a decoding circuit for the simultaneous flash memory device with a flexible bank partition architecture according to the present invention.

FIG. 2 shows an embodiment of a decoding circuit for a simultaneous operation non-volatile memory device with a flexible bank partition architecture according to the present invention. In FIG. 2, a memory array 20 comprises a plurality of memory cells arranged in a plurality of rows and columns. The memory array includes a plurality of flexibly partitioned bit lines, such as bit lines 28 and 30 as shown in FIG. 2, connected to the respective columns of memory cells in the memory array. Furthermore, the memory array 20 includes a plurality of word lines, which are shown as horizontal dashed lines, such as dashed lines 38, 40 and 42 as shown in FIG. 2, connected to the respective rows of memory cells in the memory array 20.

The bit lines in the memory array 20 each comprise a first bit line segment connected to the respective column of memory cells assigned to the upper memory bank and a second bit line segment connected to the respective column of memory cells assigned to the lower memory bank. For example, as shown in FIG. 2, the bit line 28 comprises first and second bit line segments 28a and 28b, respectively, while the bit line 30 comprises first and second bit line segments 30a and 30b, respectively. The bit line 28 has a gap 28c between the first and second bit line segments 28a and 28b, and similarly, the bit line 30 has a gap 30c between the first and second bit line segments 30a and 30b. The gaps 28c and 30c as well as gaps in the other bit lines in the memory array 20 serve as a memory partition boundary between the lower and upper memory banks.

In an embodiment, the simultaneous operation flash memory device with the flexible bank partition architecture according to the present invention further comprises first and second Y-decoders 32 and 34 coupled to the memory array 20. The first Y-decoder 32 is coupled to the first bit line segments including the bit line segments 28a and 30a for the upper memory bank, whereas the second Y-decoder 34 is coupled to the second bit line segments including the bit line segments 28b and 30b for the lower memory bank. The first Y-decoder 32 is coupled to the bit line segments for the upper memory bank in the memory array for the column decoding of the memory cells disposed along the respective bit lines in the upper memory bank. Similarly, the second Y-decoder 34 is coupled to the bit line segments in the lower memory bank for the column decoding of the memory cells disposed along the respective bit line segments in the lower memory bank. Because the columns of memory cells in the memory array 20 are physically separated by the gaps between the first and second bit line segments in the simultaneous operation flash memory device with a flexible bank partition architecture according to the present invention, two Y-decoders 32 and 34 are provided for the separate column decoding of the memory cells in the upper and lower memory banks, respectively.

FIG. 2 shows a decoding circuit for a simultaneous operation non-volatile memory device with a flexible bank partition architecture according to the present invention for the row decoding of the memory cells in the memory array 20. In this embodiment, the decoding circuit 54 comprises a single X-decoder 44, an upper bank decoder 56, a lower bank decoder 58, and a plurality of flexibly partitioned conductive lines, 60, 62, 64, 66, 68, 70, 72 and 74 positioned between the lower bank encoder 58 and the upper bank encoder 56. Each of the conductive lines has a plurality of predetermined potential gaps each corresponding to a respective one of a plurality of predetermined possible memory partition boundaries from which the partition boundary between the upper and lower memory banks can be selected. In the example shown in FIG. 2, the conductive line 60 has nine possible memory partition boundaries 60a, 60b, 60c, . . . 60i. The other conductive lines 62, 64, 66, . . . 74 have the same number of possible memory partition boundaries at corresponding locations. For example, when an upper bank/lower bank memory partition boundary of 24 MB/8 MB is desired, gaps 60e, 62e, 64e, . . . 74e are provided on the respective conductive lines 60, 62, 64, . . . 74 to separate the conductive lines into the respective first and second conductive line segments for the upper and lower memory banks.

For example, when the gap 60e is formed in the flexibly partitioned conductive line 60 to designate a memory partition boundary of 24 MB/8 MB for the upper and lower memory banks, the conductive line 60 is separated into a first conductive line segment 82 which is coupled to the upper bank decoder 56 and a second conductive line segment 84 which is coupled to the lower bank decoder 58. Similarly, the corresponding gaps in the other conductive lines 62, 64, 66, . . . 74 separate the respective conductive lines into the first and second conductive line segments coupled to the upper and lower bank decoders 56 and 58, respectively. Other gaps including gaps 60a, 60b, . . . 60d and 60f, 60g, . . . 60i along the conductive line 60 are closed electrically while the selected gap 60e is left open to define the selected upper bank/lower bank memory partition boundary of 24 MB/8 MB. In a similar manner, other gaps along the conductive lines 62, 64, 66, . . . 74 are closed electrically while the selected gaps 62e, 64e, 66e, . . . 74e are left open to define the selected upper bank/lower bank memory partition boundary of 24 MB/8 MB.

The bank address pre-decoding output ZZZ(15:8), which is an 8-bit output connected to receive the respective bank address pre-decoding bits from the respective conductive lines 60, 62, 64, . . . 74, receives some of the decoding bits from the lower bank decoder 58 and other decoding bits from the upper bank decoder 56, depending upon the locations of the gaps along the respective conductive lines. For example, when the gaps are formed at the selected locations 60e, 62e, 64e, . . . 74e along the respective conductive lines 60, 62, 64, . . . 74 designating an upper bank/lower bank memory partition of 24 MB/8 MB, the higher order bits ZZZ(15:12) of the ZZZ pre-decoding output ZZZ(15:8) are generated by the lower bank decoder 58, which is connected to the conductive line segments in rows lb(15), lb(14), lb(13) and lb(12). On the other hand, the lower order bits ZZZ (11:8) of the ZZZ pre-decoding output ZZZ(15:8) are generated by the upper bank decoder 56, which is connected to the conductive line segments in rows ub(11), ub(10), ub(9) and ub(8). The bank address pre-decoding bits ZZZ(15:8) pass through an inverter 76 to generate a plurality of Z4 pre-decoding signal bits Z4(15:8), which are transmitted to the X-decoder 44.

In the example of the simultaneous operation flash memory device with a flexible bank partition architecture according to the present invention as illustrated in FIG. 1, a minimum of 0.5 MB of memory storage in rows Z4(16) and Z4(17), which include the memory blocks SS0, SS1, SS2, . . . SS7, are reserved for code storage and therefore always allocated to the lower memory bank. Referring back to FIG. 2, the X-decoder 44 may be further coupled to receive fixed bank address pre-decoding bits such as bits Z4(16) and Z4(17) for the memory blocks SS0, SS1, SS2, . . . SS7 in the embodiment of the simultaneous operation flash memory device shown in FIG. 1. The fixed lower bank decoding inputs lb(16) and lb(17) for the reserved lower bank memory blocks SS0, SS1, SS2, . . . SS7 are passed through inverters 78 and 80, respectively, to generate the Z4 pre-decoding signal bits Z4(16) and Z4(17), which are transmitted to the X-decoder 44. The X-decoder 44 is coupled to the word lines in the memory array 20 for the row decoding of the rows of memory cells along the respective word lines in the memory array 20. In addition to the row decoding of the flexibly partitioned rows of memory cells which can be assigned to either the upper memory bank or the lower memory bank, the X-decoder 44 also performs the row decoding of the reserved rows of memory cells, such as rows Z4(16) and Z4(17) in the lower memory bank.

In an embodiment, the decoding circuit 54 for a simultaneous operation non-volatile memory device with a flexible bank partition architecture according to the present invention comprises means 90 for designating a memory partition boundary between lower and upper memory banks, an upper memory bank decoder 56 coupled to the means 90 for designating the memory partition boundary and capable of receiving at least some of a plurality of upper bank memory address bits, a lower bank memory decoder 58 coupled to the means 90 for designating the memory partition boundary and capable of receiving at least some of a plurality of lower bank memory address bits, and a bank address pre-decoding output ZZZ(15:8) coupled to the means 90 for designating the memory partition boundary, to provide pre-decoding bits Z4(15:8) to the X-decoder 44.

In an embodiment, the means 90 for designating the memory partition boundary in the decoding circuit 54 according to the present invention comprises a plurality of flexibly partitioned conductive lines, such as conductive lines 60, 62, 64, . . . 74 as shown in FIG. 2. The flexibly partitioned conductive lines each comprise first and second conductive line segments separated by a gap signifying the memory partition boundary between the lower and upper memory banks. Each of the conductive lines has a plurality of predetermined locations at which the gap can be provided to partition the conductive line into first and second conductive line segments coupled to the upper and lower bank decoders 56 and 58, respectively. The predetermined locations on each of the conductive lines, for example, the locations 60a, 60b, 60c, . . . 60i along the conductive line 60, each correspond to a respective one of a plurality of predetermined potential memory partition boundaries from which the partition boundary between the upper and lower memory banks can be selected. For example, when an upper bank/lower bank memory partition boundary of 24 MB/8 MB is desired, gaps 60e, 62e, 64e, . . . 74e are provided on the respective conductive lines 60, 62, 64, . . . 74 to separate the conductive lines into the respective first and second conductive line segments to designate the memory partition boundary of 24 MB/8 MB in the decoding circuit 54 according to the present invention.

Figure 3:
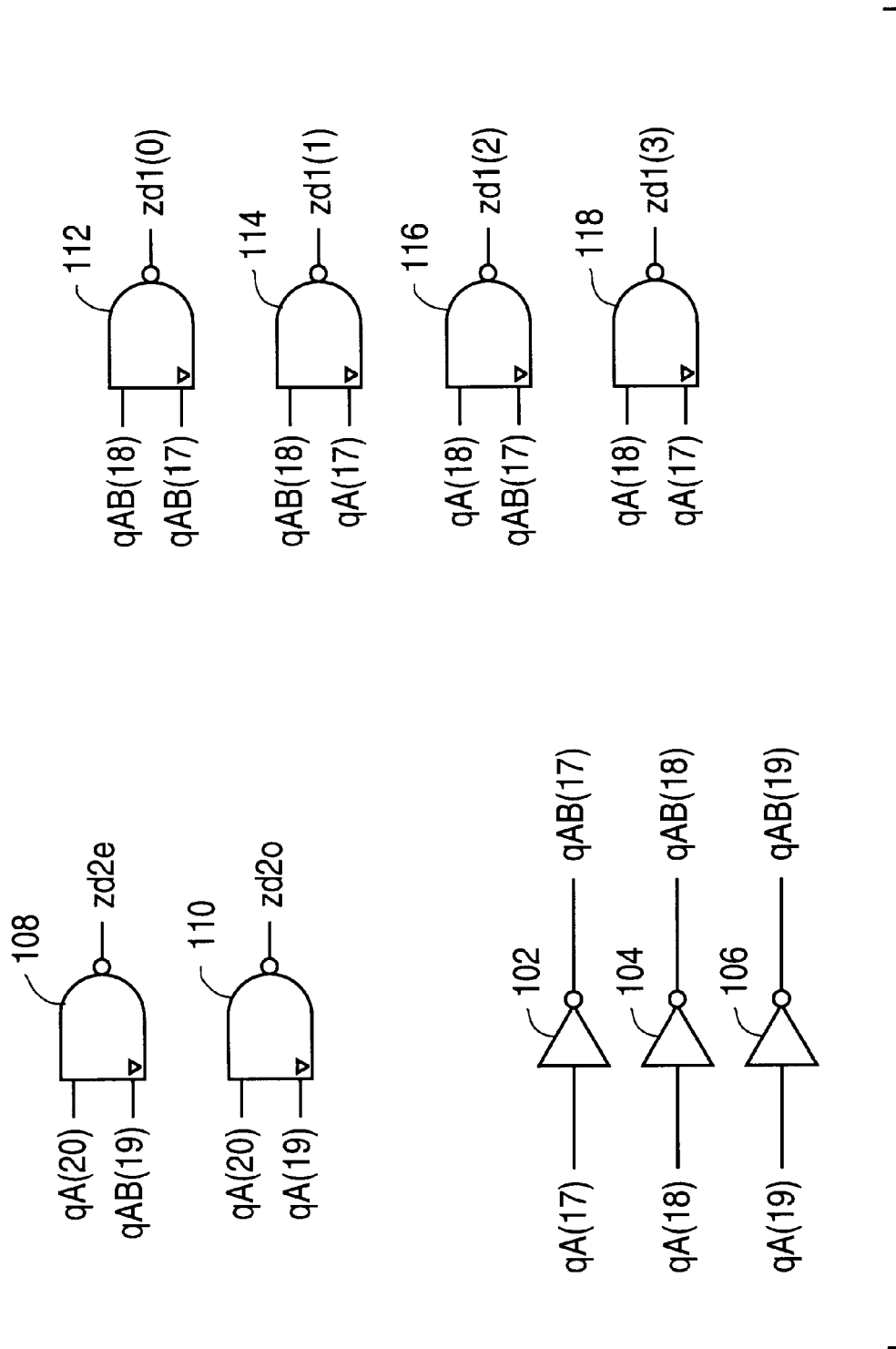
FIG. 3 shows logic diagrams of an embodiment in the initial stages of bank address pre-decoding in the lower and upper bank decoders in the decoding circuit according to the present invention.

FIG. 3 shows an embodiment of logic diagrams in the initial stages of bank address pre-decoding in the upper and lower bank decoders 56 and 58 in the decoding circuit 54 as shown in FIG. 2. The upper and lower bank decoders 56 and 58 may have an identical logic circuit structure in an embodiment. Referring to FIG. 3, the letter "q" in the notations "qA" and "qAB" represents either the letter "U" in the notation of the upper bank address bits UA which are inputs to the upper bank decoder 56, or the letter "L" in the notation of the lower bank address bits LA which are inputs to the lower bank decoder 58 in FIG. 2. Referring back to FIG. 3, the bits qAB(17), qAB(18) and qAB(19) are the inverted bits of the input memory address bits qA(17), qA(18) and qA(19), respectively. The memory address bits can be inverted by the respective inverters 102, 104 and 106 as shown in FIG. 3.

An AND operation is performed on the memory address bit qA(20) and the inverted memory address bit qAB(19) by an AND gate 108 to produce the bit zd2e, with the letter "e" denoting an even bit. The memory address bits qA(20) and qA(19) are ANDed by another AND gate 110 to generate bit zd2o, with the letter "o" denoting an odd bit. Furthermore, additional AND gates such as AND gates 112, 114, 116 and 118 are provided in the initial stages of bank address pre-decoding in the upper and lower bank decoders to generate the bits zd1(0), zd1(1), zd1(2) and zd1(3), respectively. In the example shown in FIG. 3, all possible combinations of non-inverted and inverted bits of memory address bits qA(17) and qA(18) are performed AND operations by the AND gates 112, 114, 116 and 118 to generate the respective zd1 bits.

Figure 4:
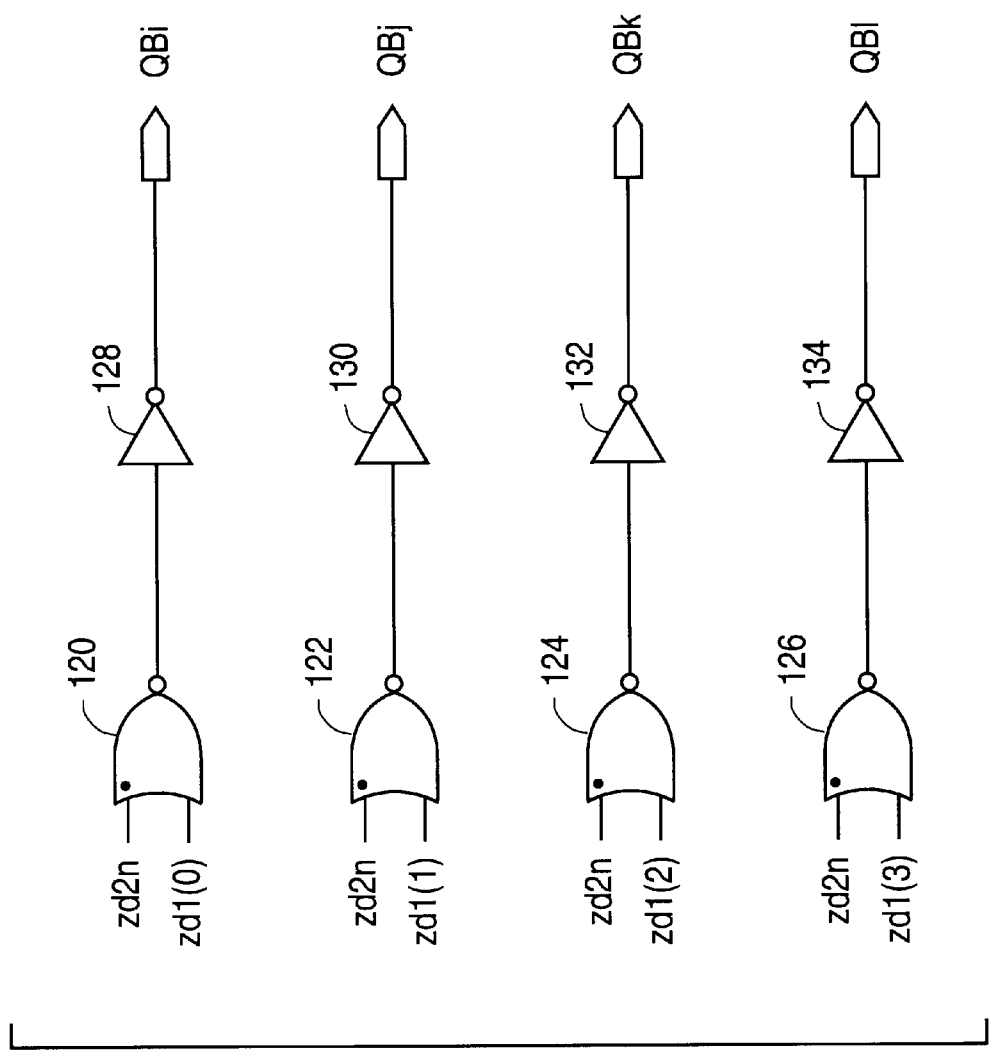
FIG. 4 shows logic diagrams of an embodiment of the final stages of bank address pre-decoding in the lower and upper bank decoders in the decoding circuit according to the present invention.

FIG. 4 shows an embodiment of logic diagrams in the final stages of bank address pre-decoding in the upper and lower bank decoders 56 and 58 as shown in FIG. 2. In this example, the zd2n bits, which represent either the zd2e bit generated by the AND gate 108 or the zd2o bit generated by the AND gate 110 in FIG. 3, are performed NOR operations with the bits zd1(0), zd1(1), zd1(2), and zd1(3) by the NOR gates 120, 122, 124, and 126 as shown in FIG. 4, respectively. The outputs of the NOR gates 120, 122, 124 and 126 then pass through inverters 128, 130, 132 and 134, respectively, to generate the respective output bits QBi, QBj, QBk, and QBl. In an embodiment, the output bits QBi, QBj, QBk and QBl as shown in FIG. 4 in the lower bank decoder 58 are transmitted to the lower bank conductive line segments lb(8), lb(9), lb(10), and lb(11), respectively. Similarly, the output bits QBi, QBj, QBk and QBl in the upper bank decoder 56 are transmitted to the upper bank conductive line segments ub(8), ub(9), ub(10), and ub(11), respectively. The pre-decoding bits for other flexibly partitioned conductive line segments can also be generated by the upper and lower bank decoders 56 and 58 using similar decoding schemes depending upon the coding of memory addresses. The pre-decoding of memory address bits as shown in FIGS. 3 and 4 and described above illustrate only some of many possibilities of memory address pre-decoding in the decoding circuit according to the present invention; other decoding schemes may also be feasible depending upon the coding of the memory address bits.

In a further embodiment, the flexibly partitioned conductive lines 60, 62, 64, . . . 74 in the decoding circuit 54 according to the present invention are fabricated from a metal layer having a plurality of predetermined memory boundary options corresponding to the predetermined partitioned boundaries, each of the memory boundary options capable of forming the gap which separates the first and second conductive line segments. In yet a further embodiment, first and second conductive line segments are formed by electrically connecting the memory boundary options along each of the flexibly partitioned conductive lines but leaving one of the memory boundary options open, to form the gap between the first and second conductive line segments. The flexibly partitioned conductive line segments in the decoding circuit 54 as well as the flexibly partitioned bit line segments in the memory array 20 according to the present invention may be fabricated by using a method of forming mask patterns for metal layers as shown in FIGS. 5–9 and described below.

FIG. 5 is a simplified plan view of a basic metal layer 2 with a plurality of basic metal layer segments 2a, 2b, 2c, . . . 2j which are formed on a semiconductor substrate 4 and serve as the basis for the fabrication of the flexibly partitioned bit line segments in the memory array as well as well as the flexibly partitioned conductive line segments in the decoding circuits as shown in FIGS. 2–4. In FIG. 5, a plurality of gaps 6a, 6b, 6c, . . . 6i are positioned between the adjacent basic metal layer segments 2a and 2b, 2b and 2c, 2c and 2d, . . . 2i and 2j, respectively. A mask pattern for the basic metal layer 2 as shown in FIG. 5 can be prepared on a computer by using a computer-aided design (CAD) technique for producing integrated circuit masks.

The basic metal layer 2 has a plurality of predetermined memory boundary options designated by the gaps 6a, 6b, 6c, . . . 6i. Each of the memory boundary options can be used to form the gap between the first and second bit line segments of each of the bit lines in the memory array or the gap between the first and second conductive line segments of each of the conductive lines in the decoding circuits to serve as the partition boundary between the upper and lower memory banks. In the case of fabricating the bit line segments in the memory array, the basic metal layer may comprise an M2 metal layer from which the bit line segments are produced.

FIG. 6 shows a simplified plan view of a metal option layer 8 comprising a plurality of metal option layer segments 8a, 8b, 8c, . . . 8h. The total number of metal option layer segments in the metal option layer 8 is one less than the total number of gaps in the basic metal layer 2. A mask pattern for the metal option layer segments 8a, 8b, 8c, . . . 8h may be prepared on a computer by using a CAD technique, and the mask patterns for the metal option layer 8 as shown in FIG. 6 and for the basic metal layer 2 as shown in FIG. 5 may be combined together by overlapping the metal option layer segments 8a, 8b, 8c, . . . 8h with the respective gaps 6a, 6b, 6c, . . . 6h but leaving the gap 6i open, to form a mask pattern for the conductive line segments 10 and 12 as shown in FIG. 7. Alternatively, two masks may be prepared for the basic metal layer and for the metal option layer separately, and the conductive line segments 10 and 12 as shown in FIG. 7 may be formed by depositing the metal option layer segments as shown in FIG. 6 on top of the respective gaps in the basic metal layer 2 as shown in FIG. 5.

FIG. 8 shows another example of the metal option layer 8 with metal option layer segments 8a, 8b, 8c, . . . 8g and 8i, such that when the mask pattern for the metal option layer 8 as shown in FIG. 8 is combined with the mask pattern for the basic metal layer 2 as shown in FIG. 5 on the computer, such that the metal option layer segments 8a, 8b, 8c, . . . 8g and 8i overlap the respective gaps 6a, 6b, 6c, . . . 6g and 6i in the basic metal layer 2, a mask pattern for conductive line segments 14 and 15 separated by the gap 6h as shown in FIG. 9 is produced. The gap 6h between the conductive line segments 14 and 16 as shown in FIG. 9 designates a memory partition boundary different from that which is designated by the gap 6i between the conductive line segments 10 and 12 as shown in FIG. 7. Therefore, the same basic metal layer pattern as shown in FIG. 5 can be used for the fabrication of the bit line segments for the upper and lower memory banks in the memory array with flexible bank partitions.

Similarly, the same basic metal layer pattern can be used for the fabrication of the flexibly partitioned conductive line segments in the decoding circuits. Only the mask pattern for the metal option layer need be changed to produce a desired gap between the bit line segments in the memory array or the conductive line segments in the decoding circuits to partition the upper and lower memory banks. For example, the flexibly partitioned bit line segments in the memory array 20 and the flexibly partitioned conductive lines 60, 62, 64 . . . 74 in the decoding circuit 54 as shown in FIG. 2 may be fabricated according to the method of preparing and combining the mask patterns for the basic metal layer and for the metal option layer described above.

Industrial Applicability

The decoding circuit for a simultaneous operation non-volatile memory device with a flexible bank partition architecture according to the present invention is applicable to the address decoding of an array of memory cells in a simultaneous operation non-volatile memory device with a flexible bank partition architecture. The simultaneous operation flash memory device with a flexible bank partition architecture comprises two memory banks with variable memory capacities depending upon the selection of a memory partition boundary from a plurality of potential memory partition boundaries. More particularly, the decoding circuit according to the present invention is able to provide a row decoding for the memory cells in the memory array with a single X-decoder and an associated pre-decoding structure which is easily adapted to flexible partitioning of the memory banks.

The invention has been described with respect to particular embodiments thereof, and numerous modifications can be made which are within the scope of the invention as set forth in the claims.

What is claimed is:

1. A decoding circuit for a simultaneous operation non-volatile memory device with a flexible bank partition architecture, comprising:
   (a) a plurality of flexibly partitioned conductive lines each comprising first and second conductive line segments separated by a gap designating a memory partition boundary between upper and lower memory banks;
   (b) an upper memory bank decoder coupled to the first conductive line segments of the flexibly partitioned conductive lines and capable of receiving at least some of a plurality of upper bank address bits;
   (c) a lower memory bank decoder coupled to the second conductive line segments of the flexibly partitioned conductive lines and capable of receiving at least some of a plurality of lower bank address bits; and
   (d) a bank address pre-decoding output capable of generating a plurality of bank address pre-decoding bits, a first plurality of the bank address pre-decoding bits coupled to the first conductive line segments for the upper memory bank and a second plurality of the bank address pre-decoding bits coupled to the second conductive line segments for the lower memory bank.

2. The decoding circuit of claim 1, further comprising an X-decoder coupled to receive the bank address pre-decoding output.

3. The decoding circuit of claim 2, wherein the X-decoder is further coupled to receive at least one fixed bank address pre-decoding input.

4. The decoding circuit of claim 3, wherein the at least one fixed bank address pre-decoding input comprises at least one fixed upper bank address pre-decoding input.

5. The decoding circuit of claim 1, further comprising an inverter coupled to the bank address pre-decoding output to invert the bank address pre-decoding bits into a plurality of inverted bank address pre-decoding bits.

6. The decoding circuit of claim 5, further comprising an X-decoder coupled to receive the inverted bank address pre-decoding bits.

7. The decoding circuit of claim 6, wherein the X-decoder is further coupled to receive at least one fixed bank address pre-decoding input.

8. The decoding circuit of claim 7, further comprising at least one inverter coupled between the at least one fixed bank address pre-decoding input and the X-decoder.

9. The decoding circuit of claim 7, wherein the at least one fixed bank address pre-decoding input comprises at least one fixed upper bank address pre-decoding input.

10. The decoding circuit of claim 1, wherein the flexibly partitioned conductive lines are fabricated from a metal layer having a plurality of predetermined memory boundary options, each of the memory boundary options capable of forming the gap which separates the first and second conductive line segments.

11. The decoding circuit of claim 10, wherein the first and second conductive line segments are formed by electrically closing the memory boundary options along each of the flexibly partitioned conductive lines but leaving one of the memory boundary options open, to form the gap between the first and second conductive line segments.

12. The decoding circuit of claim 1, wherein the flexibly partitioned conductive lines each designate a respective one of a plurality of rows of memory blocks which are capable of being flexibly allocated to either the upper memory bank or the lower memory bank.

13. A simultaneous operation non-volatile memory device, comprising:
 (a) a memory array comprising a plurality of memory cells arranged in a plurality of rows and columns;
 (b) a plurality of flexibly partitioned bit lines coupled to the respective columns of the memory cells, each of the bit lines comprising first and second bit line segments separated by a gap designating a memory partition boundary between upper and lower memory banks, the memory partition boundary selected from a plurality of predetermined partition boundaries; and
 (c) a decoding circuit, coupled to the memory array, comprising:
  (i) a plurality of flexibly partitioned conductive lines each comprising first and second conductive line segments separated by a gap designating the memory partition boundary between the upper and lower memory banks;
  (ii) an upper memory bank decoder coupled to the first conductive line segments of the flexibly partitioned conductive lines and capable of receiving at least some of a plurality of upper bank address bits;
  (iii) a lower memory bank decoder coupled to the second conductive line segments of the flexibly partitioned conductive lines and capable of receiving at least some of a plurality of lower bank address bits; and
  (iv) a bank address pre-decoding output capable of generating a plurality of bank address pre-decoding bits, a first plurality of the bank address pre-decoding bits coupled to the first conductive line segments for the upper memory bank and a second plurality of the bank address pre-decoding bits coupled to the second conductive line segments for the lower memory bank.

14. The non-volatile memory device of claim 13, wherein the decoding circuit further comprises an X-decoder coupled to the bank address pre-decoding output and capable of generating a plurality of row decoding signals for the memory array.

15. The non-volatile memory device of claim 14, wherein the X-decoder is further coupled to receive at least one fixed bank address pre-decoding input.

16. The non-volatile memory device of claim 15, wherein the at least one fixed bank address pre-decoding input comprises at least one fixed upper bank address pre-decoding input.

17. The non-volatile memory device of claim 13, wherein the decoding circuit further comprises an inverter coupled to the bank address pre-decoding output to invert the bank address pre-decoding bits into a plurality of inverted bank address pre-decoding bits.

18. The non-volatile memory device of claim 17, wherein the decoding circuit further comprises an X-decoder coupled to receive the inverted bank address pre-decoding bits.

19. The non-volatile memory device of claim 18, further comprising first and second Y-decoders coupled to the first and second bit line segments of the bit lines and capable of column decoding the upper and lower memory banks of the memory array, respectively.

20. The non-volatile memory device of claim 18, wherein the X-decoder is further coupled to receive at least one fixed bank address pre-decoding input.

21. The non-volatile memory device of claim 20, wherein the decoding circuit further comprises at least one inverter coupled between the at least one fixed bank address pre-decoding input and the X-decoder.

22. The non-volatile memory device of claim 20, wherein the at least one fixed bank address pre-decoding input comprises at least one fixed upper bank address pre-decoding input.

23. The non-volatile memory device of claim 13, wherein the flexibly partitioned conductive lines are fabricated from a metal layer having a plurality of predetermined memory boundary options corresponding to the predetermined partition boundaries, each of the memory boundary options capable of forming the gap which separates the first and second conductive line segments.

24. The non-volatile memory device of claim 23, wherein the first and second conductive line segments are formed by electrically closing the memory boundary options along each of the flexibly partitioned conductive lines but leaving one of the memory boundary options open, to form the gap between the first and second conductive line segments.

25. The non-volatile memory device of claim 13, wherein the flexibly partitioned bit lines are fabricated from a metal layer having a plurality of predetermined memory boundary options corresponding to the predetermined partition boundaries, each of the memory boundary options capable of forming the gap which separates the lower memory bank from the upper memory bank.

26. The non-volatile memory device of claim 25, wherein the first and second bit line segments are formed by electrically closing the memory boundary options along each of the bit lines but leaving one of the memory boundary options open, to form the gap between the first and second bit line segments.

27. A decoding circuit for a simultaneous operation non-volatile memory device with a flexible bank partition architecture, comprising:

(a) a plurality of flexibly partitioned conductive lines each comprising first and second conductive line segments separated by a gap designating a memory partition boundary between upper and lower memory banks;

(b) an upper memory bank decoder coupled to the first conductive line segments of the flexibly partitioned conductive lines and capable of receiving at least some of a plurality of upper bank address bits;

(c) a lower memory bank decoder coupled to the second conductive line segments of the flexibly partitioned conductive lines and capable of receiving at least some of a plurality of lower bank address bits;

(d) a bank address pre-decoding output capable of generating a plurality of bank address pre-decoding bits, a first plurality of the bank address pre-decoding bits coupled to the first conductive line segments for the upper memory bank and a second plurality of the bank address pre-decoding bits coupled to the second conductive line segments for the lower memory bank;

(e) an inverter coupled to the bank address pre-decoding output to invert the bank address pre-decoding bits into a plurality of inverted bank address pre-decoding bits; and (f) an X-decoder coupled to receive the inverted bank address pre-decoding bits.

28. The decoding circuit of claim 27, wherein the X-decoder is further coupled to receive at least one fixed bank address pre-decoding input.

29. The decoding circuit of claim 28, wherein the at least one fixed bank address pre-decoding input comprises at least one fixed upper bank address pre-decoding input.

30. The decoding circuit of claim 28, further comprising at least one inverter coupled between the at least one fixed bank address pre-decoding input and the X-decoder.

31. The decoding circuit of claim 27, wherein the flexibly partitioned conductive lines each designate a respective one of a plurality of rows of memory blocks which are capable of being flexibly allocated to either the upper memory bank or the lower memory bank.

32. The decoding circuit of claim 27, wherein the flexibly partitioned conductive lines are fabricated from a metal layer having a plurality of predetermined memory boundary options, each of the memory boundary options capable of forming the gap which separates the first and second conductive line segments.

33. The decoding circuit of claim 32, wherein the first and second conductive line segments are formed by electrically closing the memory boundary options along each of the flexibly partitioned conductive lines but leaving one of the memory boundary options open, to form the gap between the first and second conductive line segments.

34. A simultaneous operation non-volatile memory device, comprising:

(a) a memory array comprising a plurality of memory cells arranged in a plurality of rows and columns;

(b) a plurality of flexibly partitioned bit lines coupled to the respective columns of the memory cells, each of the bit lines comprising first and second bit line segments separated by a gap designating a memory partition boundary between upper and lower memory banks, the memory partition boundary selected from a plurality of predetermined partition boundaries; and (c) a decoding circuit, coupled to the memory array, comprising:

(i) a plurality of flexibly partitioned conductive lines each comprising first and second conductive line segments separated by a gap designating the memory partition boundary between the upper and lower memory banks;

(ii) an upper memory bank decoder coupled to the first conductive line segments of the flexibly partitioned conductive lines and capable of receiving at least some of a plurality of upper bank address bits;

(iii) a lower memory bank decoder coupled to the second conductive line segments of the flexibly partitioned conductive lines and capable of receiving at least some of a plurality of lower bank address bits; and (iv) a bank address pre-decoding output capable of generating a plurality of bank address pre-decoding bits, a first plurality of the bank address pre-decoding bits coupled to the first conductive line segments for the upper memory bank and a second plurality of the bank address pre-decoding bits coupled to the second conductive line segments for the lower memory bank;

(v) an inverter coupled to the bank address pre-decoding output to invert the bank address pre-decoding bits into a plurality of inverted bank address pre-decoding bits; and (vi) an X-decoder coupled to receive the inverted bank address pre-decoding bits and capable of generating a plurality of row decoding signals for the memory array.

35. The non-volatile memory device of claim 34, wherein the X-decoder is further coupled to receive at least one fixed bank address pre-decoding input.

36. The non-volatile memory device of claim 35, wherein the at least one fixed bank address pre-decoding input comprises at least one fixed upper bank address pre-decoding input.

37. The non-volatile memory device of claim 35, further comprising at least one inverter coupled between the at least one fixed bank address pre-decoding input and the X-decoder.

38. The non-volatile memory device of claim 34, further comprising first and second Y-decoders coupled to the first and second bit line segments of the bit lines and capable of column decoding the upper and lower memory banks of the memory array, respectively.

39. The non-volatile memory device of claim 34, wherein the flexibly partitioned conductive lines are fabricated from a metal layer having a plurality of predetermined memory boundary options corresponding to the predetermined partition boundaries, each of the memory boundary options capable of forming the gap which separates the first and second conductive line segments.

40. The non-volatile memory device of claim 39, wherein the first and second conductive line segments are formed by electrically closing the memory boundary options along each of the flexibly partitioned conductive lines but leaving one of the memory boundary options open, to form the gap between the first and second conductive line segments.

41. The non-volatile memory device of claim 34, wherein the flexibly partitioned bit lines are fabricated from a metal layer having a plurality of predetermined memory boundary options corresponding to the predetermined partition boundaries, each of the memory boundary options capable of forming the gap which separates the lower memory bank from the upper memory bank.

42. The non-volatile memory device of claim 41, wherein the first and second bit line segments are formed by electrically closing the memory boundary options along each of the bit lines but leaving one of the memory boundary options open, to form the gap between the first and second bit line segments.

43. A decoding circuit for a simultaneous operation non-volatile memory device with a flexible bank partition architecture, comprising:
    (a) means for designating a memory partition boundary between upper and lower memory banks;
    (b) an upper memory bank decoder coupled to the means for designating the memory partition boundary and capable of receiving at least some of a plurality of upper bank address bits;
    (c) a lower memory bank decoder coupled to the means for designating the memory partition boundary and capable of receiving at least some of a plurality of lower bank address bits; and
    (d) a bank address pre-decoding output coupled to the means for designating the memory partition boundary and capable of generating a plurality of bank address pre-decoding bits, a first plurality of the bank address pre-decoding bits for the upper memory bank and a second plurality of the bank address pre-decoding bits for the lower memory bank.

44. The decoding circuit of claim 43, further comprising an X-decoder coupled to receive the bank address pre-decoding output.

45. The decoding circuit of claim 44, wherein the X-decoder is further coupled to receive at least one fixed bank address pre-decoding input.

46. The decoding circuit of claim 45, wherein the at least one fixed bank address pre-decoding input comprises at least one fixed upper bank address pre-decoding input.

47. The decoding circuit of claim 43, further comprising an inverter coupled to the bank address pre-decoding output to invert the bank address pre-decoding bits into a plurality of inverted bank address pre-decoding bits.

48. The decoding circuit of claim 47, further comprising an X-decoder coupled to receive the inverted bank address pre-decoding bits.

49. The decoding circuit of claim 48, wherein the X-decoder is further coupled to receive at least one fixed bank address pre-decoding input.

50. The decoding circuit of claim 49, further comprising at least one inverter coupled between the at least one fixed bank address pre-decoding input and the X-decoder.

51. The decoding circuit of claim 49, wherein the at least one fixed bank address pre-decoding input comprises at least one fixed upper bank address pre-decoding input.

52. The decoding circuit of claim 43, wherein the means for designating the memory partition boundary comprises a plurality of flexibly partitioned conductive lines each comprising first and second conductive line segments separated by a gap signifying the memory partition boundary between the upper and lower memory banks.

53. The decoding circuit of claim 52, wherein the flexibly partitioned conductive lines each designate a respective one of a plurality of rows of memory blocks which are capable of being flexibly allocated to either the upper memory bank or the lower memory bank.

54. The decoding circuit of claim 52, wherein the flexibly partitioned conductive lines are fabricated from a metal layer having a plurality of predetermined memory boundary options, each of the memory boundary options capable of forming the gap which separates the first and second conductive line segments.

55. The decoding circuit of claim 54, wherein the first and second conductive line segments are formed by electrically closing the memory boundary options along each of the flexibly partitioned conductive lines but leaving one of the memory boundary options open, to form the gap between the first and second conductive line segments.

56. A simultaneous operation non-volatile memory device, comprising:
    (a) a memory array comprising a plurality of memory blocks arranged in a plurality of rows and columns;
    (b) a plurality of flexibly partitioned bit lines coupled to the memory blocks, each of the bit lines comprising first and second bit line segments separated by a gap designating a memory partition boundary between upper and lower memory banks, the memory partition boundary selected from a plurality of predetermined partition boundaries;
    (c) a decoding circuit, coupled to the memory array, comprising:
        (i) means for designating a memory partition boundary between upper and lower memory banks;
        (ii) an upper memory bank decoder coupled to the means for designating the memory partition boundary and capable of receiving at least some of a plurality of upper bank address bits;
        (iii) a lower memory bank decoder coupled to the means for designating the memory partition boundary and capable of receiving at least some of a plurality of lower bank address bits; and
        (iv) a bank address pre-decoding output coupled to the means for designating the memory partition boundary and capable of generating a plurality of bank address pre-decoding bits, a first plurality of the bank address pre-decoding bits for the upper memory bank and a second plurality of the bank address pre-decoding bits for the lower memory bank.

57. The non-volatile memory device of claim 56, wherein the decoding circuit further comprises an X-decoder coupled to the bank address pre-decoding output and capable of generating a plurality of row decoding signals for the memory array.

58. The non-volatile memory device of claim 57, wherein the X-decoder is further coupled to receive at least one fixed bank address pre-decoding input.

59. The non-volatile memory device of claim 58, wherein the at least one fixed bank address pre-decoding input comprises at least one fixed upper bank address pre-decoding input.

60. The non-volatile memory device of claim 56, wherein the decoding circuit further comprises an inverter coupled to the bank address pre-decoding output to invert the bank address pre-decoding bits into a plurality of inverted bank address pre-decoding bits.

61. The non-volatile memory device of claim 60, wherein the decoding circuit further comprises an X-decoder coupled to receive the inverted bank address pre-decoding bits.

62. The non-volatile memory device of claim 61, wherein the X-decoder is further coupled to receive at least one fixed bank address pre-decoding input.

63. The non-volatile memory device of claim 62, wherein the decoding circuit further comprises at least one inverter coupled between the at least one fixed bank address pre-decoding input and the X-decoder.

64. The non-volatile memory device of claim 62, wherein the at least one fixed bank address pre-decoding input comprises at least one fixed upper bank address pre-decoding input.

65. The decoding circuit of claim 56, wherein the means for designating the memory partition boundary comprises a plurality of flexibly partitioned conductive lines each comprising first and second conductive line segments separated by a gap signifying the memory partition boundary between the upper and lower memory banks.

66. The non-volatile memory device of claim 65, wherein the flexibly partitioned conductive lines are fabricated from a metal layer having a plurality of predetermined memory boundary options corresponding to the predetermined partition boundaries, each of the memory boundary options capable of forming the gap which separates the first and second conductive line segments.

67. The non-volatile memory device of claim 66, wherein the first and second conductive line segments are formed by electrically closing the memory boundary options along each of the flexibly partitioned conductive lines but leaving one of the memory boundary options open, to form the gap between the first and second conductive line segments.

68. The non-volatile memory device of claim 56, wherein the flexibly partitioned bit lines are fabricated from a metal layer having a plurality of predetermined memory boundary options corresponding to the predetermined partition boundaries, each of the memory boundary options capable of forming the gap which separates the lower memory bank from the upper memory bank.

69. The non-volatile memory device of claim 68, wherein the first and second bit line segments are formed by electrically closing the memory boundary options along each of the bit lines but leaving one of the memory boundary options open, to form the gap between the first and second bit line segments.

70. The non-volatile memory device of claim 56, further comprising first and second Y-decoders coupled to the first and second bit line segments of the bit lines and capable of column decoding the upper and lower memory banks of the memory array, respectively.

* * * * *